(12) United States Patent
Kim et al.

(10) Patent No.: US 12,094,919 B2
(45) Date of Patent: Sep. 17, 2024

(54) DISPLAY DEVICE INCLUDING REFLECTIVE LAYERS AND LIGHT CONVERSION LAYER ON BOTTOM OF LED REFLECTIVE LAYER ON TOP OF LED

(71) Applicant: LG DISPLAY CO., LTD., Seoul (KR)

(72) Inventors: Wonrae Kim, Paju-si (KR); SeungBum Lee, Gimpo-si (KR); YoungHoon Kim, Goyang-si (KR); Yoonsik Yang, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 409 days.

(21) Appl. No.: 17/534,190

(22) Filed: Nov. 23, 2021

(65) Prior Publication Data

US 2022/0181385 A1    Jun. 9, 2022

(30) Foreign Application Priority Data

Dec. 8, 2020 (KR) .................... 10-2020-0170028

(51) Int. Cl.
| | | |
|---|---|---|
| H01L 33/10 | (2010.01) | |
| H01L 27/15 | (2006.01) | |
| H01L 33/38 | (2010.01) | |
| H01L 33/62 | (2010.01) | |

(52) U.S. Cl.
CPC ............ *H01L 27/156* (2013.01); *H01L 33/10* (2013.01); *H01L 33/382* (2013.01); *H01L 33/62* (2013.01)

(58) Field of Classification Search
CPC ......... H01L 33/50; H01L 33/10; H01L 33/60; H01L 27/156
See application file for complete search history.

(56) References Cited

U.S. PATENT DOCUMENTS

| | | |
|---|---|---|
| 2014/0198373 A1 | 7/2014 | Ray |
| 2019/0129253 A1 | 5/2019 | Moon et al. |
| 2019/0348585 A1 | 11/2019 | Woodgate et al. |
| 2019/0356907 A1 | 11/2019 | Iguchi |
| 2020/0002604 A1 | 1/2020 | Youn et al. |
| 2020/0233136 A1 | 7/2020 | Kim et al. |
| 2020/0258867 A1 | 8/2020 | Harrold et al. |

(Continued)

FOREIGN PATENT DOCUMENTS

| | | |
|---|---|---|
| KR | 10-2019-0139636 A | 12/2019 |
| TW | 2018-37558 A | 10/2018 |
| TW | 2019-18763 A | 5/2019 |

(Continued)

OTHER PUBLICATIONS

Office Action dated Jan. 9, 2023 issued in corresponding Taiwanese Patent Application No. 110145844.

*Primary Examiner* — Joseph L Williams
(74) *Attorney, Agent, or Firm* — Morgan, Lewis & Bockius LLP

(57) ABSTRACT

A display device includes a substrate on which a plurality of sub-pixels are disposed, a first reflective layer disposed on the substrate, a plurality of LEDs disposed in each of the plurality of sub-pixels on the first reflective layer, a plurality of light conversion layers disposed between the first reflective layer and the plurality of LEDs, and a plurality of second reflective layers covering at least a portion of the plurality of LEDs. Light emitted from the plurality of LEDs is reflected by the plurality of second reflective layers, and light having a wavelength longer than that of the light emitted from the plurality of LEDs is emitted upwardly from the plurality of LEDs.

16 Claims, 15 Drawing Sheets

(56) References Cited

U.S. PATENT DOCUMENTS

2020/0341335 A1   10/2020   Tsai et al.

FOREIGN PATENT DOCUMENTS

| TW | 2019-45807 A | 12/2019 |
| TW | 2020-06465 A | 2/2020 |
| TW | 2020-10640 A | 3/2020 |
| TW | 2020-41900 A | 11/2020 |

DISPLAY DEVICE INCLUDING REFLECTIVE LAYERS AND LIGHT CONVERSION LAYER ON BOTTOM OF LED REFLECTIVE LAYER ON TOP OF LED

CROSS-REFERENCE TO RELATED APPLICATIONS

This application claims the benefit of and priority to Korean Patent Application No. 10-2020-0170028 filed on Dec. 8, 2020, in the Republic of Korea, the entire contents of which are hereby expressly incorporated by reference into the present application.

BACKGROUND

Technical Field

The present disclosure relates to a display device, and more particularly, to a display device having improved luminous efficiency.

Discussion of the Related Art

Display devices used in computer monitors, TVs, and mobile phones include organic light emitting displays (OLEDs) that emit light by themselves, and liquid crystal displays (LCDs) that require a separate light source.

Such display devices are being applied to more and more various fields including not only computer monitors and TVs, but also personal mobile devices, and thus, display devices having a reduced volume and weight while having a wide display area are being studied.

In recent years, display devices including LEDs have received attention as next-generation display devices. Since the LED is formed of an inorganic material rather than an organic material, it has excellent reliability and has a longer lifespan compared to a liquid crystal display or an organic light emitting display. In addition, the LED has a high lighting speed, high luminous efficiency and excellent stability due to high impact resistance and can display a high-brightness image.

SUMMARY

Accordingly, embodiments of the present disclosure are directed to a display device that substantially obviates one or more of the problems due to limitations and disadvantages of the related art.

An aspect of the present disclosure is to provide a display device allowing for an increase in light that is extracted to the outside of the display device.

Another aspect of the present disclosure is to provide a display device allowing for a reduction in thickness of a plurality of light conversion layers by improving external quantum efficiency.

Still another aspect of the present disclosure is to provide a display device capable of emitting light directed to side surfaces of a plurality of LEDs among light from the plurality of LEDs, to upper sides of the plurality of LEDs.

Another object of the present disclosure is to provide a display device in which total reflection of light converted in a plurality of light conversion layers is minimized.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a substrate on which a plurality of sub-pixels is disposed; a first reflective layer disposed on the substrate; a plurality of LEDs disposed in each of the plurality of sub-pixels on the first reflective layer; a plurality of light conversion layers disposed between the first reflective layer and the plurality of LEDs; and a plurality of second reflective layers covering at least a portion of the plurality of LEDs, wherein light emitted from the plurality of LEDs is reflected by the plurality of second reflective layers, and light having a wavelength longer than that of the light emitted from the plurality of LEDs is emitted upwardly from the plurality of LEDs. Therefore, total reflection can be minimized by the adjacent first reflective layer in a process in which the light emitted from the plurality of LEDs is converted into light having a long wavelength in the light conversion layers under the plurality of LEDs, and light emitted upwardly of the plurality of LEDs can be reduced.

In another aspect, a display device comprises a substrate: a first reflective layer disposed on the substrate; a plurality of light conversion layers disposed on the first reflective layer; a plurality of blue LEDs disposed on the plurality of light conversion layers; and a plurality of second reflective layers disposed to cover at least a portion of the plurality of blue LEDs, wherein the plurality of second reflective layers reflects blue light emitted from the plurality of blue LEDs toward the plurality of light conversion layers and transmit light from the plurality of light conversion layers. Accordingly, in a display device of top emission type, the light conversion layers and the first reflective layer are disposed on lower portions of the LEDs instead of upper portions thereof, so that total reflection can be reduced and external quantum efficiency of the display device can increase.

Other detailed matters of the exemplary embodiments are included in the detailed description and the drawings.

According to the present disclosure, luminance of a display device can be improved by increasing light emitted to the outside of the display device.

According to the present disclosure, it is possible to minimize total reflection of light inside a display device.

According to the present disclosure, stability of light conversion layers can be improved by forming the light conversion layers and LEDs on different substrates.

According to the present disclosure, power consumption of a display device can be reduced by increasing external quantum efficiency of the display device.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Figure 1:
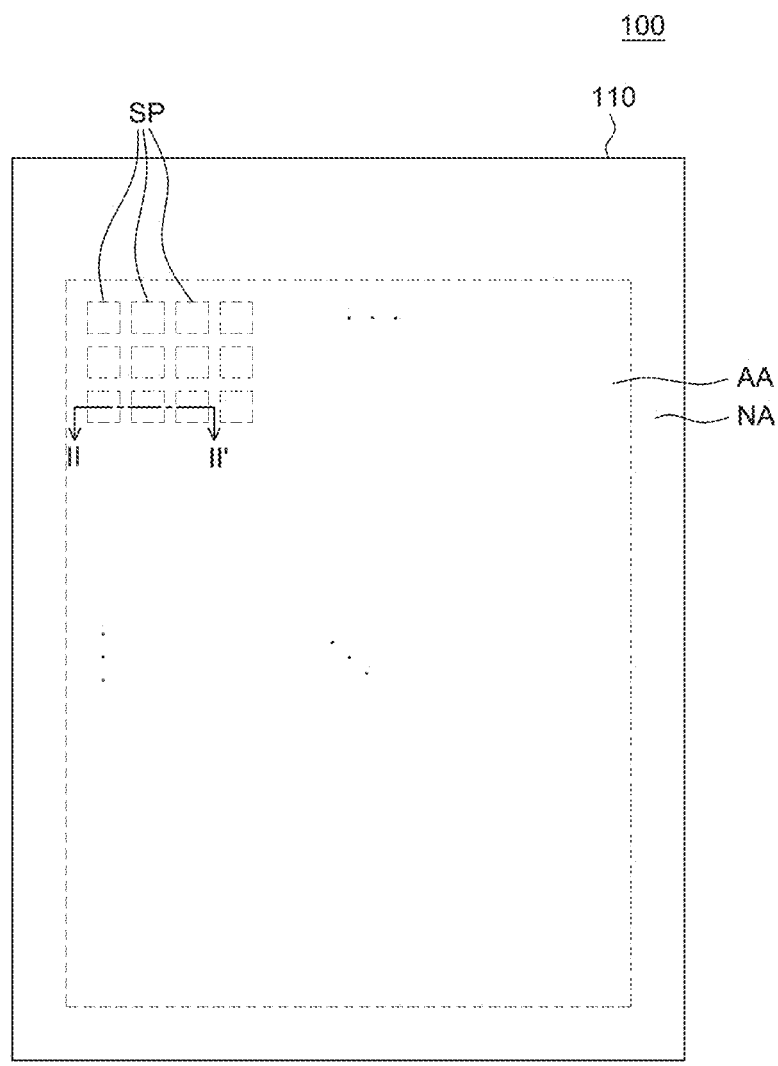
FIG. 1 is a schematic plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a schematic plan view of a display device according to an exemplary embodiment of the present disclosure. In FIG. 1, only a first substrate 110 and sub-pixels SP are illustrated among various components of a display device 100 for convenience of explanation.

The first substrate 110 is a component for supporting various components included in the display device 100 and may be formed of an insulating material. For example, the first substrate 110 may be formed of glass or resin. In addition, the first substrate 110 may include a polymer or plastic, or may be formed of a material having flexibility. For example, the first substrate 110 may be a silicon (Si) substrate.

The first substrate 110 includes a display area AA and a non-display area NA.

The display area AA is an area in which a plurality of the sub-pixels SP constituting a plurality of pixels are disposed to display an image. A light emitting element and a driving circuit for driving the light emitting element may be disposed in each of the plurality of sub-pixels SP of the display area AA. For example, an LED and a semiconductor element for driving the LED may be disposed in each of the plurality of sub-pixels SP.

The non-display area NA is an area in which an image is not displayed, and is an area in which various lines, driver ICs, and the like for driving the sub-pixels SP disposed in the display area AA are disposed. For example, various ICs and driving circuits such as a gate driver IC and a data driver IC may be disposed in the non-display area NA. Meanwhile, the non-display area NA may be located on a rear surface of the first substrate 110, that is, on a surface on which the sub-pixels SP are not present, or may be omitted, but are not limited thereto.

The plurality of sub-pixels SP are defined in the display area AA of the first substrate 110. Each of the plurality of sub-pixels SP is an individual unit emitting light, and the light emitting element emitting light such as an LED may be formed in each of the plurality of sub-pixels SP. For example, the plurality of sub-pixels SP may include a red sub-pixel, a green sub-pixel, and a blue sub-pixel, but are not limited thereto.

Figure 2:
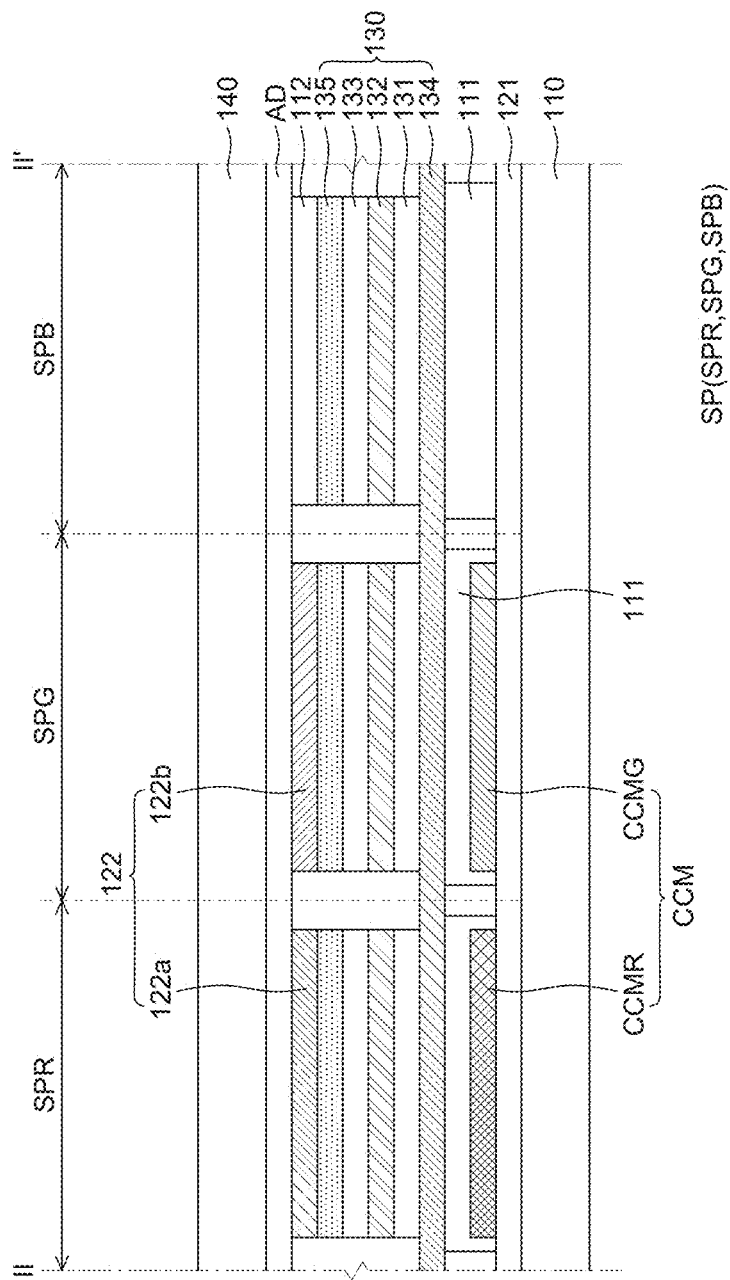
FIG. 2 is a cross-sectional view taken along II-II' of FIG. 1.
Figure 3:
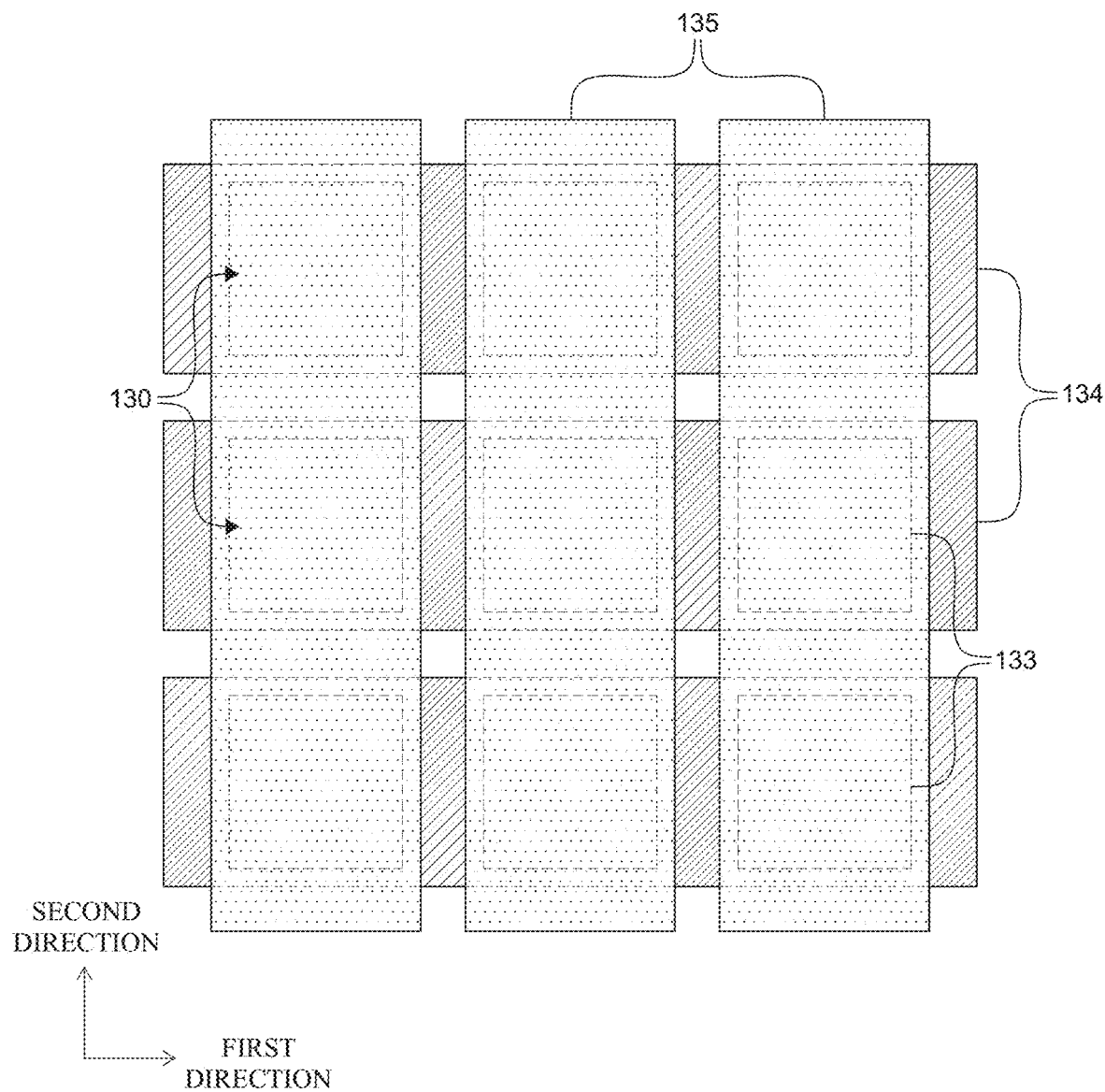
FIG. 3 is a schematic enlarged plan view of the display device according to an exemplary embodiment of the present disclosure.

Hereinafter, FIGS. 2 and 3 are referred together for a more detailed description of the plurality of sub-pixels SP.

FIG. 2 is a cross-sectional view taken along II-II' of FIG. 1. FIG. 3 is a schematic enlarged plan view of the display device according to an exemplary embodiment of the present disclosure. In FIG. 3, only second semiconductor layers 133, first electrodes 134, and second electrodes 135 of a plurality of LEDs 130 are illustrated for convenience of explanation. Referring to FIG. 2, the display device 100 according to an exemplary embodiment of the present disclosure includes the first substrate 110, a first reflective layer 121, second reflective layers 122, a plurality of light conversion layers CCM, the plurality of LEDs 130, a plurality of insulating layers 111, a plurality of transparent resin layers 112, an adhesive layer AD, and a second substrate 140.

Referring to FIG. 2, the first reflective layer 121 is disposed on the first substrate 110. The first reflective layer 121 reflects light that is directed toward the first substrate 110 among light emitted from the plurality of LEDs 130, toward the second substrate 140, to improve luminous efficiency of the display device 100. The first reflective layer 121 may be formed of a material having high reflective efficiency. For example, the first reflective layer 121 may be formed of an opaque metallic material such as aluminum (Al) or silver (Ag), but is not limited thereto.

The plurality of LEDs 130 is disposed on the first reflective layer 121. The plurality of LEDs 130 is disposed on the first reflective layer 121, the plurality of light conversion layers CCM, and the plurality of insulating layers 111 in the plurality of respective sub-pixels SP. The plurality of LEDs 130 is light emitting elements that emit light by electric current. The plurality of LEDs 130 may include LEDs that emit red light, green light, blue light, or light in an ultraviolet region, and a combination of these LEDs or a combination of the plurality of LEDs 130 and the light conversion layers CCM may implement light of various colors including white.

The plurality of LEDs 130 may be formed in various structures, such as a horizontal structure, a vertical structure, and a flip-chip structure. The LED having a horizontal structure includes a light emitting layer 132 and an N-type electrode and a P-type electrode that are horizontally disposed on both sides of the light emitting layer 132. The LED having a horizontal structure may emit light by combining electrons supplied to the light emitting layer 132 through the N-type electrode and holes supplied to the light emitting layer 132 through the P-type electrode. The LED having a vertical structure includes the light emitting layer 132, an N-type electrode and a P-type electrode disposed above and below the light emitting layer 132. The LED having a vertical structure can also emit light by a combination of electrons and holes supplied from the electrodes, like the LED having a horizontal structure. The LED having a flip-chip structure has substantially the same structure as the LED having a horizontal structure. However, the LED of the flip-chip structure may be directly attached to a printed circuit board or the like with omission of a medium such as a metal wire. Hereinafter, for convenience of explanation, it will be described assuming that the plurality of LEDs 130 have a vertical structure, but the present disclosure is not limited thereto.

Meanwhile, the plurality of LEDs 130 may emit light of different colors or may emit light of the same color. For example, when the plurality of LEDs 130 emits light of different colors, the LED 130 disposed in a red sub-pixel SPR among the plurality of sub-pixels SP is an LED that emits red light, the LED 130 disposed in a green sub-pixel SPG may be an LED emitting green light, and the LED 130 disposed in a blue sub-pixel SPB may be an LED emitting blue light.

On the other hand, when the plurality of LEDs 130 emits light of the same color, colors of light emitted from the plurality of respective LEDs 130 may be converted into various colors by using the light conversion layer CCM together. Hereinafter, it will be described assuming that all of the plurality of LEDs 130 are LEDs emitting blue light, but the present disclosure is not limited thereto.

The plurality of LEDs 130 includes a first semiconductor layers 131, the light emitting layers 132, the second semiconductor layers 133, the first electrodes 134, and the second electrodes 135.

First, the light emitting layer 132 is disposed on the first semiconductor layer 131, and the second semiconductor layer 133 is disposed on the light emitting layer 132. The first semiconductor layer 131 and the second semiconductor layer 133 may be layers formed by implanting n-type impurities or p-type impurities into gallium nitride (GaN). For example, one of the first semiconductor layer 131 or the second semiconductor layer 133 may be a layer formed by implanting p-type impurities into gallium nitride, and the other thereof may be a layer formed by implanting n-type impurities into gallium nitride. The p-type impurities may be magnesium (Mg), zinc (Zn), beryllium (Be), or the like, and the n-type impurities may be silicon (Si), germanium (Ge), tin (Sn) or the like, but are not limited thereto.

The light emitting layer 132 is disposed between the first semiconductor layer 131 and the second semiconductor layer 133. The light emitting layer 132 may receive holes and electrons from the first semiconductor layer 131 and the second semiconductor layer 133 to emit light. In this case, since the plurality of LEDs 130 are blue LEDs, the light emitting layers 132 may be blue light emitting layers that emit blue light. The light emitting layer 132 may have a single layer or multi-quantum well (MQW) structure, for example, the light emitting layer 132 may be formed of indium gallium nitride (InGaN), gallium nitride (GaN) or the like, but is not limited thereto.

Referring to FIGS. 2 and 3 together, a plurality of the first electrodes 134 are disposed under the first semiconductor layer 131. The plurality of first electrodes 134 may be electrically connected to the first semiconductor layer 131. Each of the plurality of first electrodes 134 may be electrically connected to the first electrodes 134 adjacent thereto in a first direction. The first electrodes 134 adjacent to each other in the first direction may be integrally formed and electrically connected. For example, some LEDs 130 disposed in the same line among the plurality of LEDs 130 may be electrically connected to one first electrode 134. That is, the plurality of LEDs 130 disposed in the same line extending in the first direction may share one first electrode 134.

The plurality of first electrodes 134 may be formed of indium tin oxide (ITO), indium zinc oxide (IZO), indium tin zinc oxide (ITZO), zinc oxide (ZnO) and tin oxide (TO)-based transparent conductive oxides so that light emitted from the light emitting layers 132 is directed toward the light conversion layers CCM, but the present disclosure is not limited thereto.

A plurality of the second electrodes 135 are disposed on the second semiconductor layers 133. The plurality of second electrodes 135 may be electrically connected to the second semiconductor layers 133. Each of the plurality of second electrodes 135 may be electrically connected to the second electrodes 135 adjacent thereto in a second direction different from the first direction. The second electrodes 135 adjacent to each other in the second direction may be integrally formed and electrically connected. The plurality of second electrodes 135 may extend in the second direction and intersect the plurality of first electrodes 134. For example, some LEDs 130 disposed in the same line among the plurality of LEDs 130 may be electrically connected to one second electrode 135. That is, the plurality of LEDs 130 disposed in the same line extending in the second direction may share one second electrode 135.

The plurality of second electrodes 135 may be formed of indium tin oxide (ITO), indium zinc oxide (IZO), indium tin zinc oxide (ITZO), zinc oxide (ZnO) and tin oxide (TO)-based transparent conductive oxides so that light emitted from the light emitting layers 132 and light that is converted in the light conversion layers CCM travel toward the second substrate 140, but the present disclosure is not limited thereto.

Although not shown in the drawings, the plurality of first electrodes 134 and the plurality of second electrodes 135 may receive voltages from driver ICs. For example, the plurality of first electrodes 134 and the plurality of second electrodes 135 may extend to the non-display area NA and be connected to the driver ICs of the non-display area NA. Further, the plurality of first electrodes 134 and the plurality of second electrodes 135 may extend to the non-display area NA and may be connected to a semiconductor element and the like supplied with a voltage or the like from the driver ICs and receive a common voltage.

Meanwhile, in FIG. 2, although it is described assuming that the plurality of LEDs 130 is vertical structure, the plurality of LEDs 130 may be configured in other structure. For example, when the plurality of LEDs 130 is horizontal structure, a portion of the first semiconductor layers 131 protrudes from the light emitting layers 132, and the plurality of first electrodes 134 may be disposed on upper surfaces of the first semiconductor layers 131 that protrude from the light emitting layers 132. In addition, the plurality of second electrodes 135 may be disposed on upper surfaces of the plurality of second semiconductor layers 133 in the same manner as in the vertical structure. In addition, when the plurality of LEDs 130 is a flip-chip structure, the first electrodes 134 may be disposed on lower surfaces of the first semiconductor layers 131. And, a portion of the second semiconductor layers 133 may protrude from the light emitting layers 132, and the second electrodes 135 may be in contact with lower surfaces of the second semiconductor layers 133 protruding from the light emitting layers 132.

Meanwhile, the display device 100 may be driven in a passive matrix or active matrix method. As shown in FIG. 3, the plurality of LEDs 130 that share the first electrodes 134 and the second electrodes 135 that cross each other may be driven in a passive matrix method. The passive matrix method is a method, in which when a signal is applied after disposing the first electrodes 134 and the second electrodes 135 to cross each other, light is generated from a portion where the first electrodes 134 and the second electrodes 135 cross each other.

Compared to the passive matrix method, the active matrix method may further include transistors serving as switches to thereby individually turn on or off the plurality of respective LEDs 130. Hereinafter, it is described assuming that the display device 100 according to an exemplary embodiment of the present disclosure is in the passive matrix method, but the present disclosure is not limited thereto.

Meanwhile, the display device 100 may be configured in a top emission type or a bottom emission type according to a direction in which light emitted from the plurality of LEDs 130 is emitted.

The top emission type is a type in which light emitted from the plurality of LEDs 130 is emitted upwardly of the plurality of LEDs 130, for example, toward the second substrate 140. In the case of the top emission type, a reflective layer such as the first reflective layer 121 may be formed under the plurality of LEDs 130 so that the light emitted from the plurality of LEDs 130 travels upwardly to the second substrate 140.

The bottom emission type is a type in which light emitted from the plurality of LEDs 130 is emitted downwardly of the plurality of LEDs 130, for example, toward the first substrate 110. In the case of the bottom emission type, a reflective layer may be formed over the plurality of LEDs 130 so that the light emitted from the plurality of LEDs 130 travels downwardly of the first substrate 110. Hereinafter, it is described assuming that the display device 100 according to an exemplary embodiment of the present disclosure is a top emission type display device.

The plurality of light conversion layers CCM is disposed between the first reflective layer 121 and the plurality of LEDs 130. The plurality of light conversion layers CCM may convert the light emitted from the plurality of LEDs 130 into light of various colors. Each of the plurality of light conversion layers CCM may include light conversion materials that absorb light emitted from the plurality of LEDs 130 and convert the light into light of a different color. The light conversion material may be formed of, for example, a nano-phosphor, an organic phosphor, a quantum dot, or a fluorescent dye, but is not limited thereto. In addition, the light conversion layer CCM may further include a scattering material to increase probability that the light emitted from the plurality of LEDs 130 is absorbed into the light conversion materials.

The plurality of light conversion layers CCM include a red light conversion layer CCMR and a green light conversion layer CCMG. The red light conversion layer CCMR may be disposed in the red sub-pixel SPR and convert blue light from the plurality of LEDs 130 into red light. The green light conversion layer CCMG may be disposed in the green sub-pixel SPG and convert blue light from the plurality of LEDs 130 into green light.

In this case, a separate light conversion layer CCM may not be disposed in the blue sub-pixel SPB among the plurality of sub-pixels SP. As described above, since the light emitted from the plurality of LEDs 130 is blue light, it is not necessary to convert the blue light emitted from the plurality of LEDs 130 into light of a different color, and the blue light emitted from the plurality of LEDs 130 may be emitted upwardly to the second substrate 140 as it is.

The plurality of insulating layers 111 are disposed between the plurality of light conversion layers CCM and the plurality of LEDs 130. Each of the plurality of insulating layers 111 may be disposed to surround an upper surface and a side surface of each of the plurality of light conversion layers CCM. Each of the plurality of insulating layers 111 may be disposed to cover and protect each of the plurality of light conversion layers CCM. Also, the plurality of insulating layers 111 may planarize an upper portion of the first substrate 110 on which the plurality of light conversion layers CCM are disposed. For example, the plurality of insulating layers 111 may be formed of polyimide or an acryl-based organic material, but are not limited thereto.

The plurality of insulating layers 111 may be disposed to be spaced apart from each other. Each of the plurality of insulating layers 111 surrounding the plurality of light conversion layers CCM may be spaced apart from each other, and an empty space may be formed between the plurality of insulating layers 111. By spacing the plurality of insulating layers 111 from each other, color mixing of the plurality of sub-pixels SP may be reduced. If the insulating layers 111 are integrally formed on an entire surface of the first substrate 110, light that is converted in each of the plurality of light conversion layers CCM may be transmitted to the sub-pixels SP adjacent thereto through the insulating layers 111. Unlike this, when the plurality of insulating layers 111 are patterned and spaced apart from each other, the light converted in the plurality of light conversion layers CCM may be transmitted only within the plurality of insulating layers 111, and may be difficult to be transmitted to other insulating layers spaced apart therefrom. Since air having a lower refractive index than that of the plurality of insulating layers 111 is disposed between the plurality of insulating layers 111, it may be difficult for light from one insulating layer 111 to be transmitted to another neighboring insulating layer 111. Accordingly, color mixing between the plurality of sub-pixels SP may be reduced by spacing the plurality of insulating layers 111 from each other.

Meanwhile, although not shown in the drawings, banks may be further disposed between the plurality of insulating layers 111. The banks are disposed at boundaries between the plurality of sub-pixels SP, so that color mixing can be reduced. The banks may be formed of an organic insulating material, and may be formed of an acryl-based resin, a benzocyclobutene (BCB)-based resin, or polyimide, but the present disclosure is not limited thereto. In addition, the banks may be configured to further include a black material to reduce color mixing.

A plurality of the second reflective layers 122 is disposed on the plurality of LEDs 130. The plurality of second reflective layers 122 may be disposed in some of the plurality of sub-pixels SP and may reflect one portion of light directed toward the second substrate 140 and transmit the other portion thereof. Specifically, the plurality of second reflective layers 122 may reflect light that is directed toward the second substrate 140 among the light emitted from the plurality of LEDs 130, toward the first substrate 110. In addition, the plurality of second reflective layers 122 may transmit the light directed toward the second substrate 140 among light that is converted in the plurality of light conversion layers CCM. That is, the plurality of second reflective layers 122 may reflect the light emitted from the plurality of LEDs 130 and transmit light having a wavelength longer than that of the light emitted from the plurality of LEDs 130. The plurality of second reflective layers 122 may be a distributed Bragg reflector (DBR) formed by stacking dielectric layers having different refractive indices. For example, the second reflective layers 122 may be implemented by alternately stacking a high refractive index material and a low refractive index material. In this case, light in a specific wavelength range may be selectively transmitted and reflected by controlling the number and thickness of the stacked dielectric layers.

The plurality of second reflective layers 122 include a second red transmissive reflective layer 122a and a second green transmissive reflective layer 122b. The second red transmissive reflective layer 122a is disposed in the red sub-pixel SPR and may reflect blue light emitted from the plurality of LEDs 130 toward the red light conversion layer CCMR. The second red transmissive reflective layer 122a may transmit red light converted in the red light conversion layer CCMR. The second green transmissive reflective layer 122b is disposed in the green sub-pixel SPG and may reflect blue light emitted from the plurality of LEDs 130 toward the green light conversion layer CCMG. The second green transmissive reflective layer 122b may transmit green light converted in the green light conversion layer CCMG.

The second reflective layer 122 may not be disposed in the blue sub-pixel SPB among the plurality of sub-pixels SP. Since the light emitted from the plurality of LEDs 130 is blue light, there is no need to convert it into light of a different color in the light conversion layer CCM, and the blue light emitted from the plurality of LEDs 130 can be emitted upwardly to the second substrate 140. Instead, the transparent resin layers 112 may be disposed on the plurality of LEDs 130 in the blue sub-pixel SPB. By disposing the transparent resin layers 112 on the plurality of LEDs 130, blue light emitted from the plurality of LEDs 130 may be emitted upwardly to the second substrate 140.

Meanwhile, in the present disclosure, it has been described that the second red transmissive reflective layer 122a is formed in the red sub-pixel SPR and the second green transmissive reflective layer 122b is formed in the green sub-pixel SPG, but one second reflective layer 122 may be formed in the red sub-pixel SPR and the green sub-pixel SPG. For example, the second reflective layers 122 that reflect blue light and transmit green light and red light may be integrally formed in the red sub-pixel SPR and the green sub-pixel SPG, but the present disclosure is not limited thereto.

The adhesive layer AD is disposed on the plurality of second reflective layers 122 and the transparent resin layer 112. The adhesive layer AD may be formed of a transparent material having adhesive properties, and may be a heat-curable or natural-curable adhesive or an adhesive film. For example, the adhesive layer AD may be formed of an optical clear adhesive (OCA), a pressure sensitive adhesive (PSA), or the like, but is not limited thereto.

The second substrate 140 is disposed on the adhesive layer AD. The second substrate 140 may protect components under the second substrate 140 from external impacts, moisture, heat, and the like. The second substrate 140 may be formed of a material having impact resistance and light transmittance. For example, the second substrate 140 may be formed of glass or may be a thin film formed of a plastic material such as polymethylmethacrylate (PMMA), polyimide, or polyethylene terephthalate (PET).

Hereinafter, a method of manufacturing the display device 100 according to an exemplary embodiment of the present disclosure will be described with reference to FIGS. 4a to 4h.

Figure 4A:
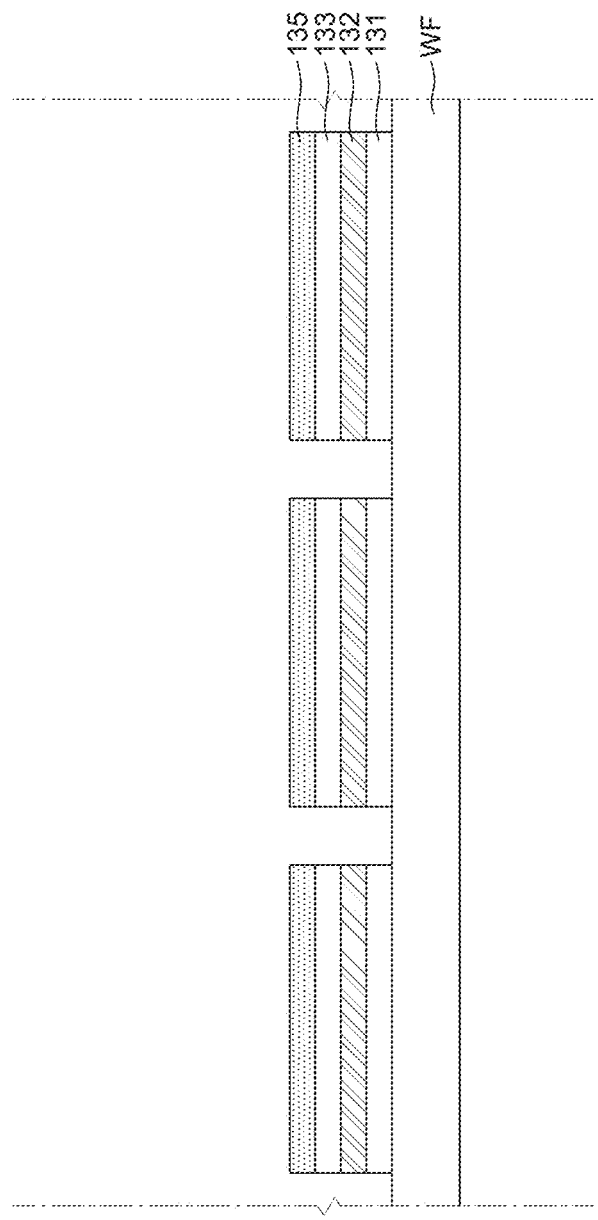
FIG. 4A to FIG. 4H are process diagrams for explaining a method of manufacturing the display device according to an exemplary embodiment of the present disclosure.
Figure 4B:
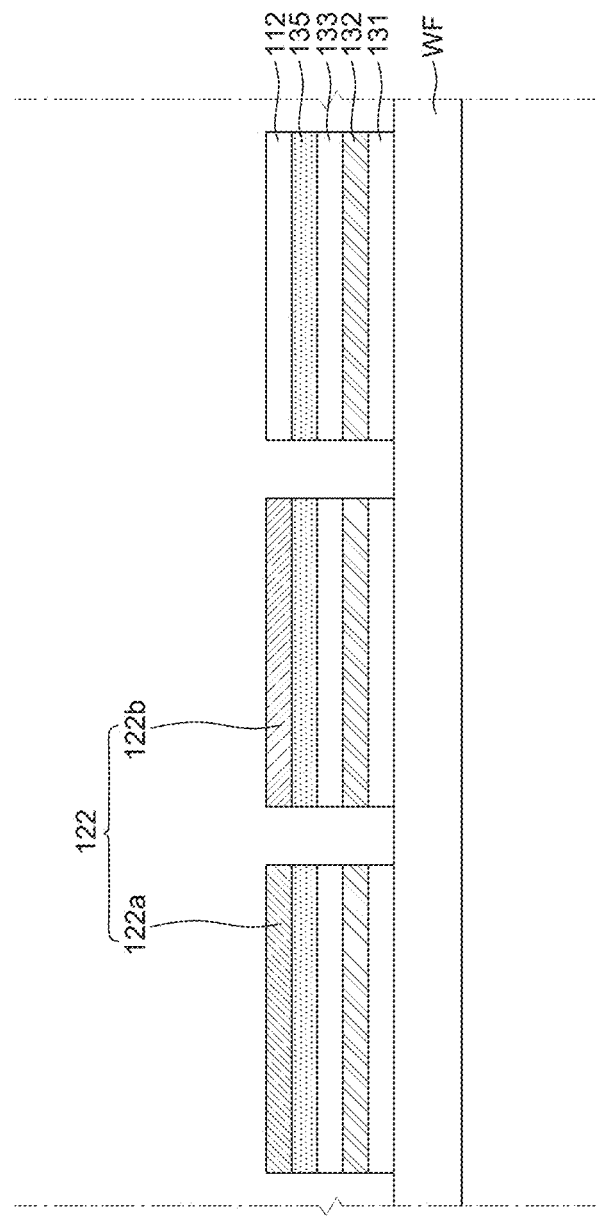
Figure 4C:
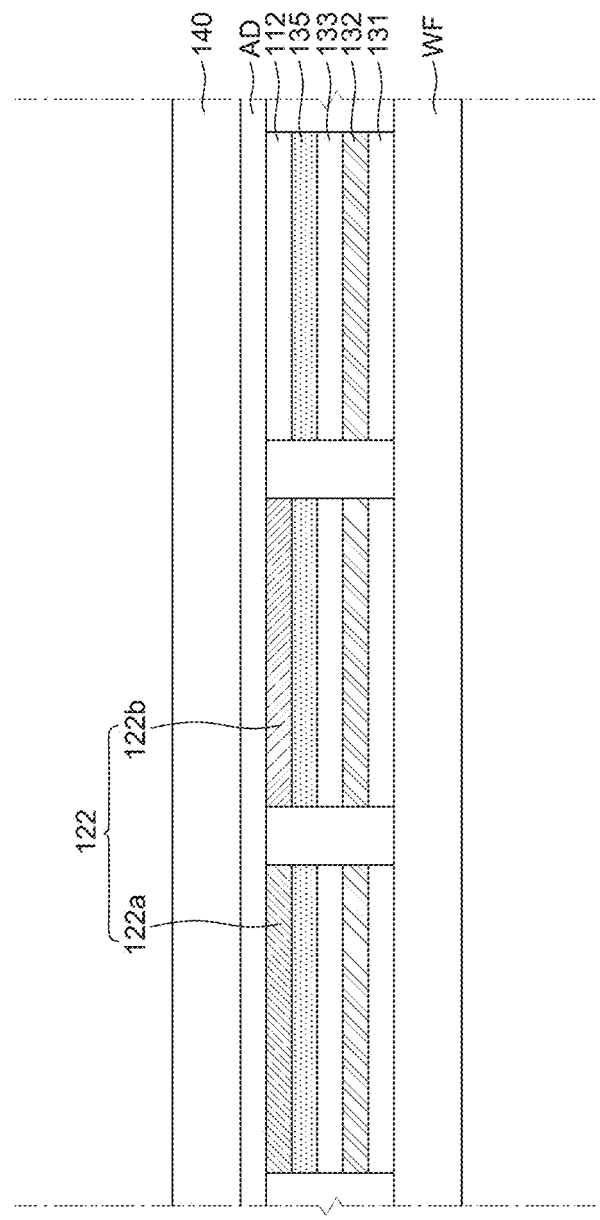
Figure 4D:
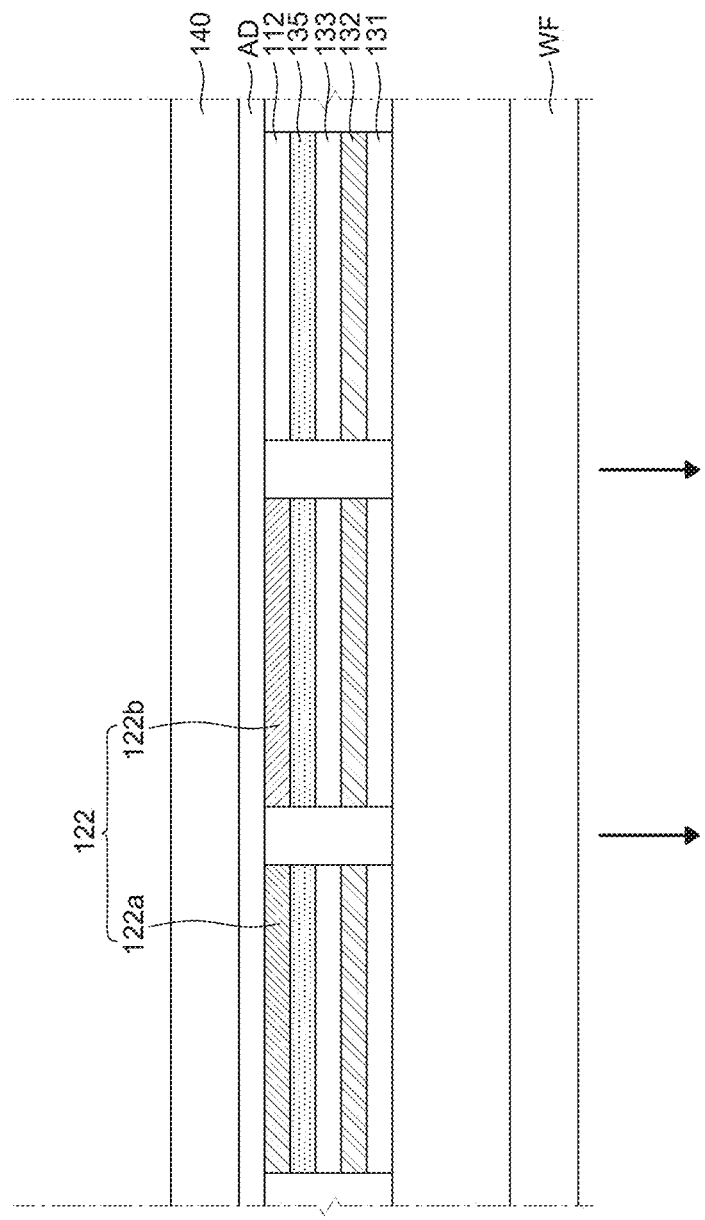
Figure 4E:
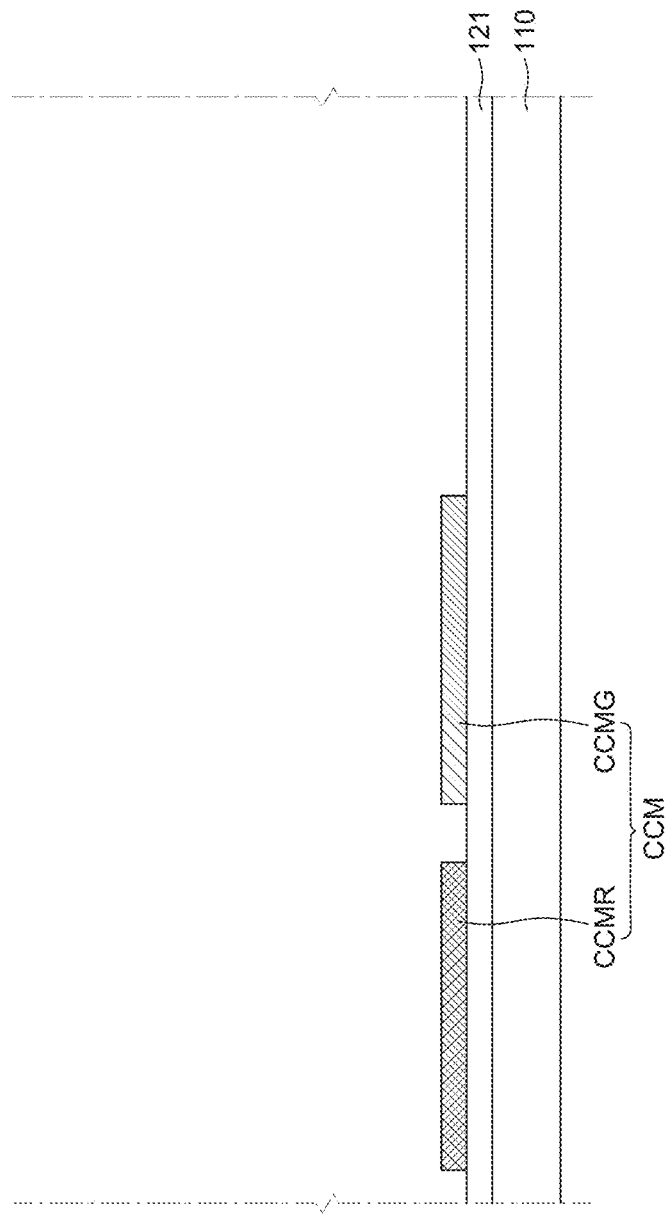
Figure 4F:
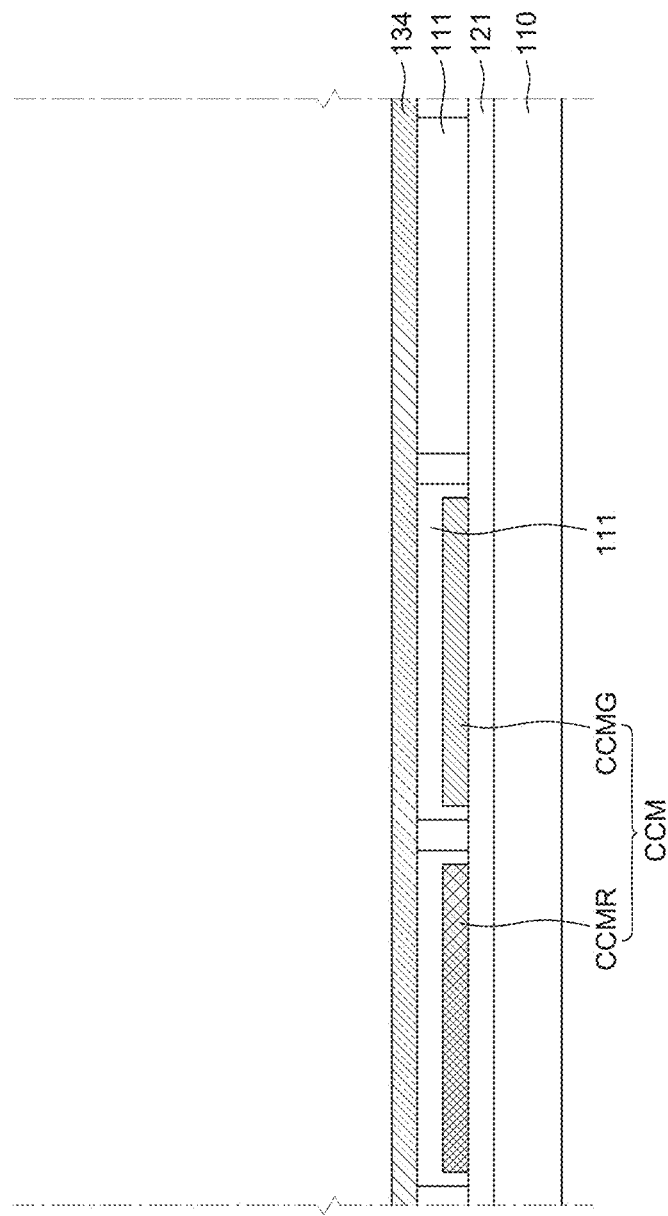
Figure 4G:
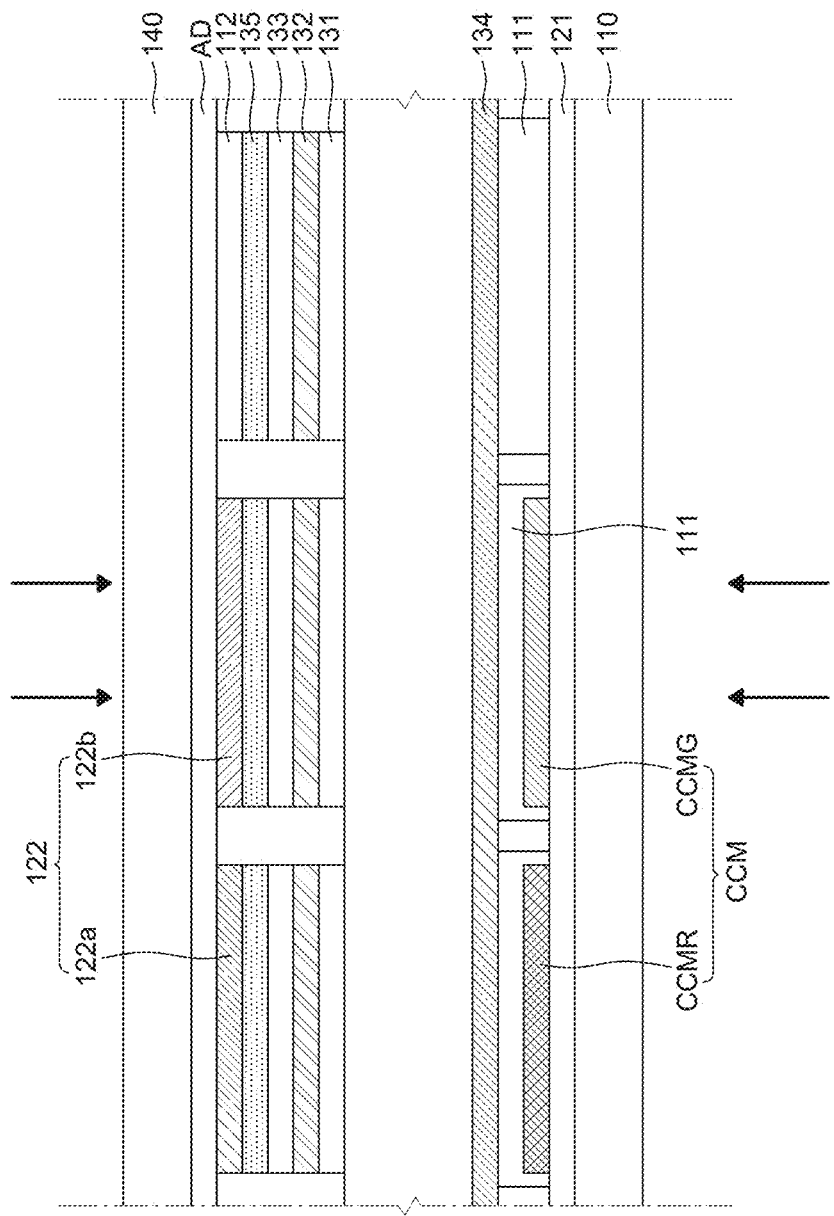
Figure 4H:
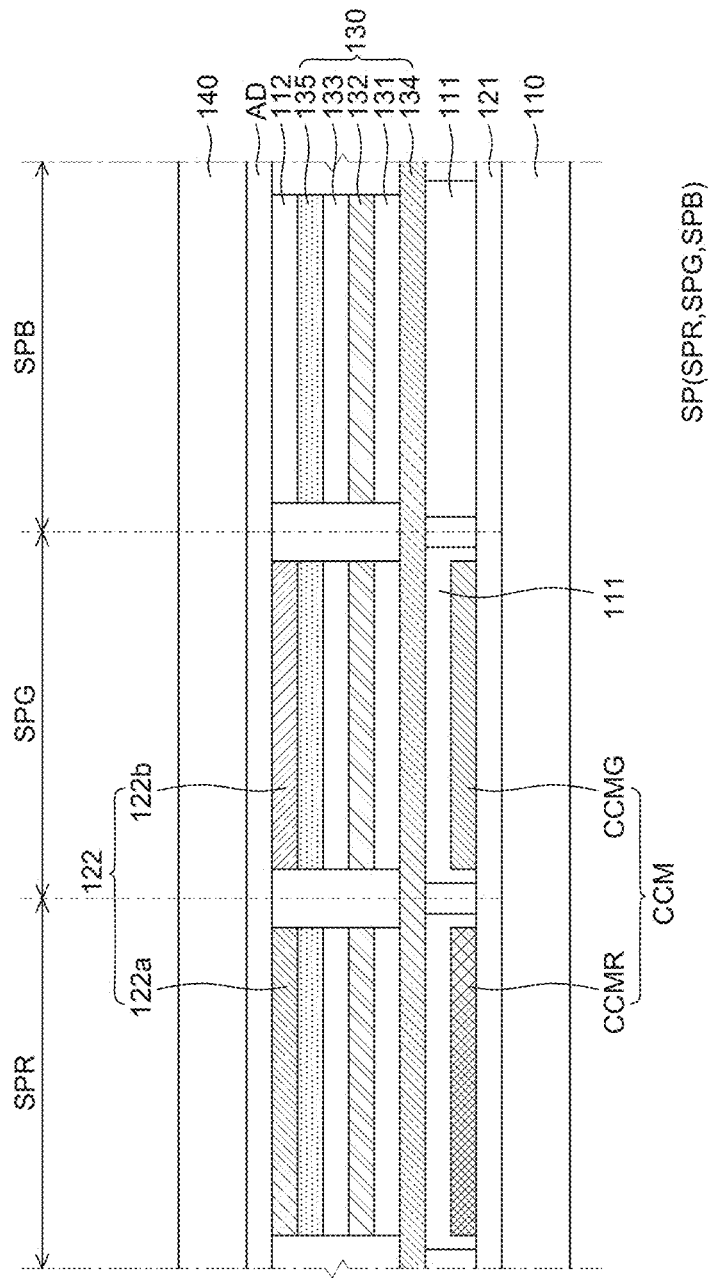

FIG. 4A to FIG. 4H are process diagrams for explaining a method of manufacturing the display device according to an exemplary embodiment of the present disclosure. FIG. 4A to FIG. 4D are process diagrams for explaining a process of forming the plurality of LEDs 130 on the second substrate 140. FIG. 4E and FIG. 4F are process diagrams for explaining a process of forming the plurality of light conversion layers CCM on the first substrate 110. FIG. 4G and FIG. 4H are process diagrams for explaining a process of bonding the first substrate 110 and the second substrate 140 together.

Referring to FIG. 4A, after forming the first semiconductor layers 131, the light emitting layers 132, and the second semiconductor layers 133 of the plurality of LEDs 130 on a wafer WF, the plurality of second electrodes 135 are formed.

First, in order to form the first semiconductor layers 131, the light emitting layers 132, and the second semiconductor layers 133, an epitaxial layer may be formed on the wafer WF.

The wafer WF is a substrate on which an epitaxial layer for forming the plurality of LEDs 130 is grown. The wafer WF may be formed of sapphire, silicon carbide (SiC), gallium nitride (GaN), zinc oxide (ZnO), or the like, but is not limited thereto.

The epitaxial layer is for forming the plurality of LEDs 130, and may have a structure in which materials constituting layers forming the plurality of LEDs 130 are sequentially stacked. For example, the epitaxial layer may be formed by sequentially growing a material forming the first semiconductor layer 131, a material forming the light emitting layer 132, and a material forming the second semiconductor layer 133 on the wafer WF.

Subsequently, the epitaxial layer may be processed to form the first semiconductor layers 131, the light emitting layers 132, and the second semiconductor layers 133 of the plurality of LEDs 130. Specifically, a plurality of epitaxial layers may be patterned to form the first semiconductor layers 131, the light emitting layers 132, and the second semiconductor layers 133 of the plurality of respective LEDs 130.

Next, the plurality of second electrodes 135 are formed on the plurality of second semiconductor layers 133. The plurality of second electrodes 135 may be formed to extend in the second direction and contact the plurality of second semiconductor layers 133.

Next, referring to FIG. 4B, the plurality of second reflective layers 122 and the plurality of transparent resin layers 112 are formed on the plurality of LEDs 130. Specifically, the second red transmissive reflective layer 122a may be formed on the second electrode 135 in the red sub-pixel SPR, and the second green transmissive reflective layer 122b may be formed on the second electrode 135 in the green sub-pixel SPG. In addition, the transparent resin layer 112 may be formed on the second electrode 135 in the blue sub-pixel SPB.

Referring to FIG. 4C, the adhesive layer AD and the second substrate 140 are attached onto the plurality of second reflective layers 122 and the transparent resin layer 112. The second substrate 140 may be attached onto the plurality of LEDs 130 through the adhesive layer AD.

Next, referring to FIG. 4D, the plurality of LEDs 130 and the wafer WF are separated. In a state in which the plurality of LEDs 130 is attached to the second substrate 140, the wafer WF may be separated from the plurality of LEDs 130. For example, the wafer WF may be separated using a laser lift-off (LLO) technique. In the case of laser lift-off, when a laser is irradiated to the wafer WF, laser absorption occurs at an interface between the plurality of LEDs 130 and the wafer WF, so that the plurality of LEDs 130 and the wafer WF may be separated. However, the wafer WF may be separated by other methods other than the laser lift-off, but the present disclosure is not limited thereto.

Next, referring to FIG. 4E, the first reflective layer 121 and the plurality of light conversion layers CCM are formed on the first substrate 110. Specifically, after the first reflective layer 121 is formed on an entire surface of the first substrate 110, the plurality of light conversion layers CCM may be formed in regions corresponding to the red sub-pixel SPR and the green sub-pixel SPG among the plurality of sub-pixels SP. In this case, since the plurality of LEDs 130 are blue LEDs, a separate light conversion layer CCM may not be formed in a region corresponding to the blue sub-pixel SPB.

Next, referring to FIG. 4F, the plurality of insulating layers 111 and the first electrode 134 are formed on the plurality of light conversion layers CCM and the first reflective layer 121.

First, the plurality of insulating layers 111 may be formed to correspond to the plurality of respective sub-pixels SP. Specifically, a material forming the insulating layer 111 may be formed on the entire surface of the first substrate 110 on which the plurality of light conversion layers CCM and the first reflective layer 121 are formed. In addition, the plurality of insulating layers 111 corresponding to the plurality of respective sub-pixels SP may be formed by patterning the material forming the insulating layer 111 in regions overlapping boundaries of the plurality of sub-pixels SP. In this case, the plurality of insulating layers 111 may be disposed to surround upper surfaces and side surfaces of the plurality of respective light conversion layers CCM in the red sub-pixel SPR and the green sub-pixel SPG. In addition, in the plurality of blue sub-pixels SPB, the plurality of insulating layers 111 may be disposed to cover the upper surface of the first reflective layer 121.

Meanwhile, when the plurality of insulating layers 111 and the banks are formed together, the plurality of insulating layers 111 may be formed between the banks after forming the banks overlapping the boundaries of the plurality of sub-pixels SP.

Subsequently, the plurality of first electrodes 134 may be formed on the plurality of insulating layers 111. The plurality of first electrodes 134 extending in the first direction and spaced apart from each other may be formed on the plurality of insulating layers 111.

Next, referring to FIG. 4G and FIG. 4H, the first substrate 110 on which the first reflective layer 121 and the plurality of light conversion layers CCM are formed, and the second substrate 140 on which the plurality of LEDs 130 and the plurality of second reflective layers 122 are formed may be bonded to thereby complete forming of the display device 100. Specifically, the first semiconductor layers 131 of the plurality of LEDs 130 on the second substrate 140 may be attached to the plurality of first electrodes 134 on the first substrate 110 to thereby complete forming of the plurality of LEDs 130 and the display device 100.

In the display device 100 according to an exemplary embodiment of the present disclosure, the light conversion layers CCM and the first reflective layer 121 are formed in a direction opposite to a light emission direction, so that light that is totally reflected in a horizontal direction and is not extracted to the outside of the display device 100 may be reduced. Specifically, the display device 100 according to an exemplary embodiment of the present disclosure is a display device 100 of a top emission type in which light emitted from the plurality of LEDs 130 is emitted upwardly to the second substrate 140, that is, toward the second substrate 140. However, when total reflection occurs, the light emitted from the plurality of LEDs 130 does not travel in a vertical direction but travels in the horizontal direction, so it may be difficult to be extracted to the outside of the display device 100. However, in the display device 100 according to an exemplary embodiment of the present disclosure, blue light traveling to the first substrate 110 by the second reflective layer 122 may be converted into light of a different color in the light conversion layer CCM. The converted light may be reflected back to an upper portion of the LED 130 by the first reflective layer 121. At this time, the light conversion layer CCM and the first reflective layer 121 are disposed adjacent to each other and may change a path of the light that is converted in the light conversion layer CCM to the upper portion of the LED 130 and reduce totally reflected light.

Hereinafter, a light extraction effect of the display device 100 according to an exemplary embodiment of the present disclosure will be described with reference to FIG. 5a to FIG. 7.

Figure 5A:
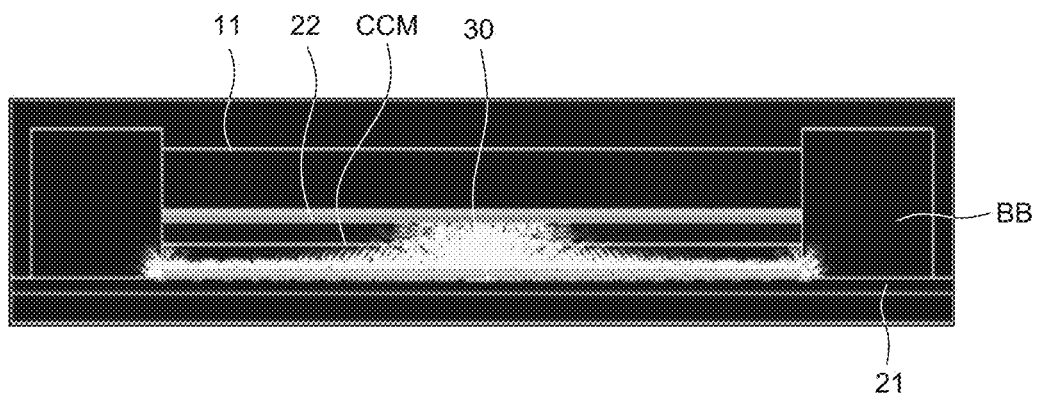
FIG. 5A is a cross-sectional view illustrating blue light emitted from a plurality of LEDs of a display device according to a comparative embodiment.
Figure 5B:
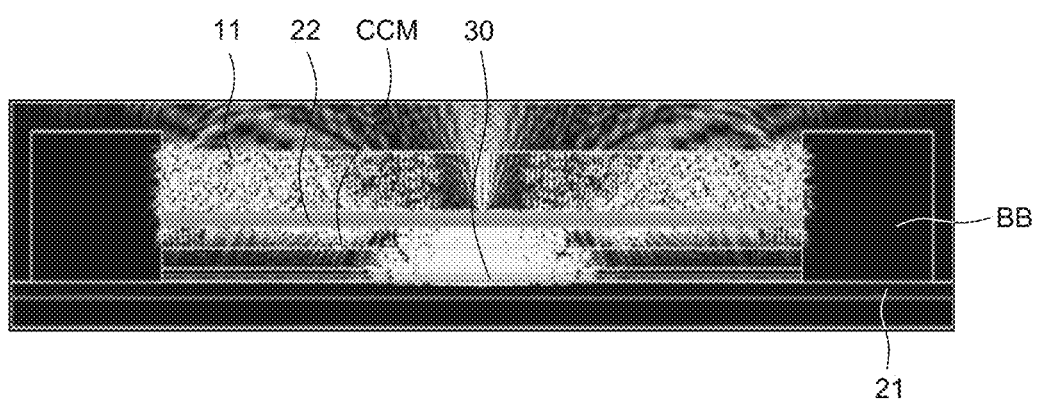
FIG. 5B is a cross-sectional view illustrating light that is converted in a plurality of light conversion layers of the display device according to the comparative embodiment.
Figure 6A:
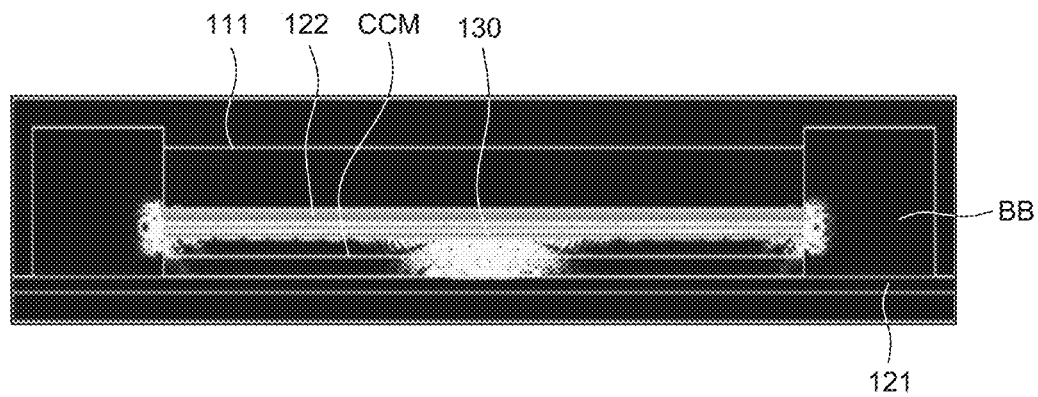
FIG. 6A is a cross-sectional view illustrating blue light emitted from a plurality of LEDs of a display device according to exemplary embodiment.
Figure 6B:
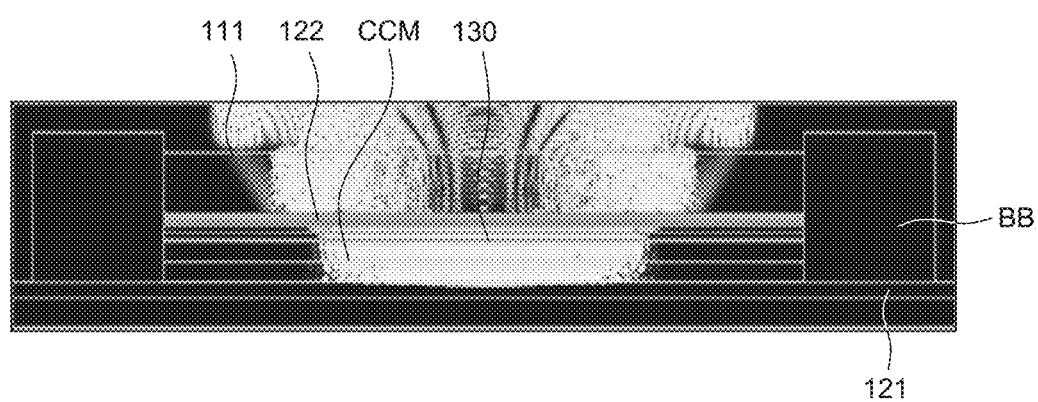
FIG. 6B is a cross-sectional view illustrating light that is converted in a plurality of light conversion layers of the display device according to exemplary embodiment.
Figure 7:
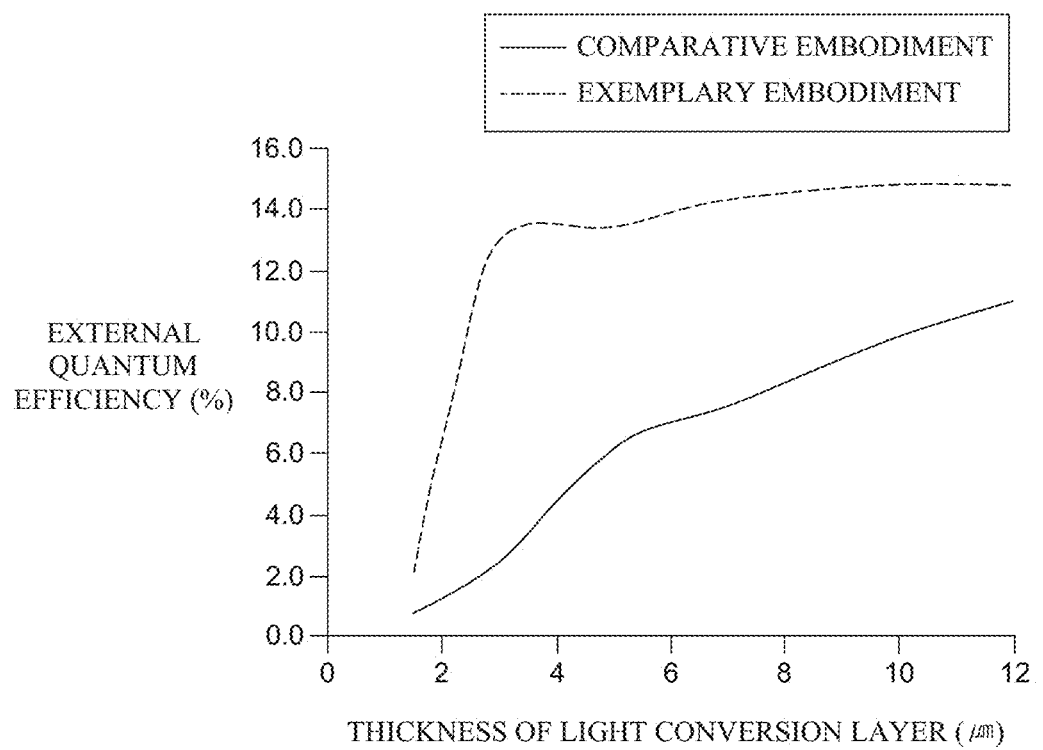
FIG. 7 is a graph illustrating external quantum efficiency according to thicknesses of light conversion layers in the display devices according to the comparative embodiment and exemplary embodiment.

FIG. 5A is a cross-sectional view illustrating blue light emitted from a plurality of LEDs of a display device according to a comparative embodiment. FIG. 5B is a cross-sectional view illustrating light that is converted in a plurality of light conversion layers of the display device according to the comparative embodiment. FIG. 6A is a cross-sectional view illustrating blue light emitted from a plurality of LEDs of a display device according to exemplary embodiment. FIG. 6B is a cross-sectional view illustrating light that is converted in a plurality of light conversion layers of the display device according to exemplary embodiment. FIG. 7 is a graph illustrating external quantum efficiency according to thicknesses of light conversion layers in the display devices according to the comparative embodiment and exemplary embodiment.

A display device 10 according to the comparative embodiment has a structure including a first reflective layer 21, black banks BB disposed on the first reflective layer 21, an LED 30 disposed between the black banks BB, a light conversion layer CCM on the LED 30, a second reflection layer 22 on the light conversion layer CCM, and an insulating layer 11 on the second reflection layer 22. The display device 100 according to exemplary embodiment has a structure including the first reflective layer 121, black banks BB disposed on the first reflective layer 121, the light conversion layer CCM disposed between the black banks BB, the LED 130 on the light conversion layer CCM, the second reflective layer 122 on the LED 130, and the insulating layer 111 on the second reflective layer 122. That is, the display device 10 according to the comparative embodiment has a structure in which the light conversion layer CCM and the second reflective layer 22 are disposed on the LED 30, and the display device 100 according to exemplary embodiment has a structure in which the light conversion layer CCM is disposed on a lower portion of the LED 130 and the second reflective layer 122 is disposed on an upper portion of the LED 130.

Referring to FIG. 5A, in the display device 10 according to the comparative embodiment, it can be seen that blue light emitted from the LED 30 does not pass through the second reflective layer 22 and is reflected toward the first reflective layer 21. Specifically, the second reflective layer 22 may reflect the blue light and transmit red light and green light. Accordingly, the blue light emitted from the LED 30 may be reflected by the second reflective layer 22.

Referring to FIG. 5B, it can be seen that the blue light reflected by the first reflective layer 21 and the blue light emitted from the LED 30 travel to the light conversion layer CCM and are converted into light of a different color, and then, travel upwardly to the second reflective layer 22. Specifically, the blue light reflected in a direction toward an upper portion of the LED 30, which is a light emission direction from the first reflective layer 21, and the blue light emitted from the LED 30 may travel to the light conversion layer CCM. In addition, the blue light may spread and travel to an entire surface of the light conversion layer CCM in a process of being converted into light of a different color in the light conversion layer CCM. That is, a path of some of light traveling in a vertical direction which is the light emission direction, from the first reflective layer 21 and the LED 30, may be changed in the light conversion layer CCM.

In this case, some of the light of which the path has changed in the light conversion layer CCM may travel to the black banks BB on sides of the LED 30 and be absorbed by the black banks BB. Specifically, the light conversion layer CCM may include a scattering material to improve light conversion efficiency. Accordingly, probability that the blue light emitted from the LED 30 may be scattered in the light conversion layer CCM and absorbed onto light conversion materials may increase, and light conversion efficiency of the light conversion layer CCM may be improved.

However, a path of some of the light that has scattered and converted in the light conversion layer CCM is changed with respect to the LED 30 and may travel with an inclination with respect to the LED 30. For example, an incident angle of some of blue light traveling in a direction perpendicular to the LED 30 is changed in the process in which the light is converted into light of a different color in the light conversion layer CCM, and the path of the light may be changed. If the incident angle of the light is greater than a critical angle, total reflection occurs and externally extracted light decreases, and light that travels to the side of the LED 30 and is absorbed by the black bank BB may increase. Therefore, in the display device of the top emission type like the display device 10 according to the comparative embodiment, when the light conversion layer CCM is disposed on the upper portion of the LED 30, during the process in which the light is converted in the light conversion layer CCM, the path of the light is converted, so that total reflected light may increase, and light extraction efficiency may decrease.

Next, referring to FIG. 6A, in the display device 100 according to exemplary embodiment, it can be seen that the blue light emitted from the LED 130 does not pass through the second reflective layer 122 and is reflected toward the first reflective layer 121 and the light conversion layer CCM.

Referring to FIG. 6B, the blue light reflected from the second reflective layer 122 and the blue light emitted from the LED 130 may be converted into light of a different color in the light conversion layer CCM. It can be seen that most of the light that is converted in the light conversion layer CCM travels toward the upper portion of the LED 130, instead of being directed toward the sides of the LED 130. Accordingly, in the display device 100 according to exemplary embodiment, compared to the display device 10 according to the comparative example, it can be seen that light that is converted in the light conversion layer CCM and travels to the black bank BB is reduced.

Specifically, the blue light reflected from the second reflective layer 122 may travel toward the light conversion layer CCM and the first reflective layer 121. At this time, the light that is converted in the light conversion layer CCM travels toward the first reflective layer 121 in contact with the light conversion layer CCM, and then is reflected toward the upper portion of the LED 130 from the first reflective layer 121. In this case, the light reflected from the first reflective layer 121 may travel in a direction perpendicular to the LED 130 as much as possible. Therefore, an incident angle of the light reflected from the first reflective layer 121 may be close to a vertical angle, and total reflection may be reduced. Accordingly, in the display device 100 according to exemplary embodiment, since the light conversion layer CCM and the first reflective layer 121 are disposed under the LED 130, the path of the light that is converted in the light conversion layer CCM may be transmitted in a direction perpendicular to the LED 130 to reduce total reflection and may improve light extraction efficiency.

Next, referring to FIG. 7, in the display devices 10 and 100 according to the comparative embodiment and the exemplary embodiment, it can be seen that external quantum efficiency increases as a thickness of the light conversion layer CCM increases. Specifically, as the thickness of the light conversion layer CCM increases, probability that light is absorbed into the light conversion materials in the light conversion layer CCM may increase. That is, the thickness of the light conversion layer CCM may be proportional to the light conversion efficiency.

The external quantum efficiency is a ratio determined based on internal quantum efficiency, which is a ratio at which injected charges are converted into photons, and light extraction efficiency of extracting the photons to the outside. When the external quantum efficiency increases, externally extracted light may increase and luminance may increase.

In this case, when the thickness of the light conversion layer CCM is the same, the display device 100 according to exemplary embodiment may have external quantum efficiency higher than external quantum efficiency of the display device 10 according to the comparative embodiment. Specifically, as described above with reference to FIGS. 5a to 6b, in the display device 10 according to the comparative embodiment, totally reflected light among the light that is converted in the light conversion layer CCM increases, so light that is extracted to the outside of the display device 10 may decrease. On the other hand, in the display device 100 according to exemplary embodiment, totally reflected light among the light that is converted in the light conversion layer CCM decreases, so light that is extracted to the outside of the display device 100 may increase. Therefore, even when the same amount of light is converted in the light conversion layer CCM, light that is extracted to the outside is reduced by total reflection in the display device 10 according to the comparative embodiment, while in the display device 100 according to exemplary embodiment, the total reflection is reduced and the light that is extracted to the outside of the display device 100 may increase. Therefore, in the display device 100 according to exemplary embodiment, even if a light conversion layer CCM thinner than that of the display device 10 according to the comparative embodiment is used, external quantum efficiency thereof is high, so that luminance of the display device 100 may be kept at the same level.

In the display device 100 according to an exemplary embodiment of the present disclosure, the light conversion layer CCM and the first reflective layer 121 are disposed under the plurality of LEDs 130 in a top emission method, so that light that is extracted outside of the display device 100 may increase. Specifically, the blue light emitted from the plurality of LEDs 130 may travel toward the first reflection layer 121 under the plurality of LEDs 130 by the second reflection layer 122. The light traveling downwardly of the plurality of LEDs 130 may be converted into light of a different color in the light conversion layer CCM. In addition, a traveling direction of the light that is converted in the light conversion layer CCM may be changed in a direction upwardly from the plurality of LEDs 130 by the first reflective layer 121, and light of which a traveling direction is changed to a direction toward the sides of the plurality of LEDs 130 rather than upwardly from the plurality of LEDs 130 by the light conversion layer CCM may be reduced. Accordingly, in the display device 100 according to an exemplary embodiment of the present disclosure, the light that is converted in the light conversion layer CCM may travel upwardly from the plurality of LEDs 130 by disposing the light conversion layer CCM and the first reflective layer 121 to be adjacent to each other, thereby reducing total reflection and improving luminance of the display device 100.

The display device 100 according to an exemplary embodiment of the present disclosure may reduce a manufacturing cost and power consumption by reducing the thickness of the light conversion layer CCM. As the thickness of the light conversion layer CCM increases, light that is converted in the light conversion layer CCM may increase. However, in some cases, in order to increase the thickness of the light conversion layer CCM, a process of forming the light conversion layer CCM needs to be performed several times. For example, in a method of forming the light conversion layer CCM by spin coating a photoresist containing phosphors, a thickness thereof that can be formed with only one process is limited, so the process may be performed several times to obtain a thick light conversion layer CCM. In addition, when the number of processes increases, a manufacturing cost increases. However, the display device 100 according to an exemplary embodiment of the present disclosure has higher external quantum efficiency compared to a case in which the light conversion layer CCM is disposed in the light emission direction like the display device 10 according to the comparative embodiment. Therefore, even when the thickness of the light conversion layer CCM is reduced, the light that is converted in the light conversion layer CCM may be emitted to the outside of the display device 100 as much as possible. Accordingly, in the display device 100 according to an exemplary embodiment of the present disclosure, sufficient luminance can be realized even when the thickness of the light conversion layer CCM can be reduced, thereby reducing a manufacturing cost and time required for forming the light conversion layer CCM. In addition, even if the thickness of the light conversion layer CCM is formed equally to that of existing one, the same level of luminance can be realized with lower power consumption, so power consumption can be reduced.

The display device 100 according to an exemplary embodiment of the present disclosure may secure stability of the plurality of light conversion layers CCM by forming the light conversion layers CCM on a substrate different from that of the plurality of LEDs 130. If the light conversion layers CCM are formed on the same substrate as the plurality of LEDs 130, the light conversion layers CCM may be affected during a process. For example, when the light conversion layers CCM include an organic material, properties of the light conversion layers CCM may be changed when high-temperature heat due to other processes is applied. For example, when forming the light conversion layers CCM on a substrate, it may be difficult to uniformly form the thickness of the light conversion layers CCM due to various components formed on the substrate, and efficiency of the light converted in the light conversion layers CCM may also be configured non-uniformly. Accordingly, in the display device 100 according to an exemplary embodiment of the present disclosure, after the plurality of light conversion layers CCM are formed on the first substrate 110 on which the first reflective layer 121 is formed and the plurality of LEDs 130 are formed on the second substrate 141, the display device 100 may be manufactured by bonding the first substrate 110 and the second substrate 140 together. At this time, since the plurality of light conversion layers CCM and the plurality of LEDs 130 are formed on different substrates, influences applied to the plurality of light conversion layers CCM in the process of forming the plurality of LEDs 130 can be minimized. In addition, since the plurality of light conversion layers CCM are formed on the first reflective layer 121 formed on the entire surface of the first substrate 110, it is possible to remove steps that may be caused by a plurality of lines or driving elements, and the thickness of the light conversion layer CCM can be formed uniformly. Accordingly, by forming the plurality of light conversion layers CCM and the plurality of LEDs 130 separately, it is possible to minimize changes in characteristics of the plurality of light conversion layers CCM or a decrease in light conversion efficiency.

Figure 8:
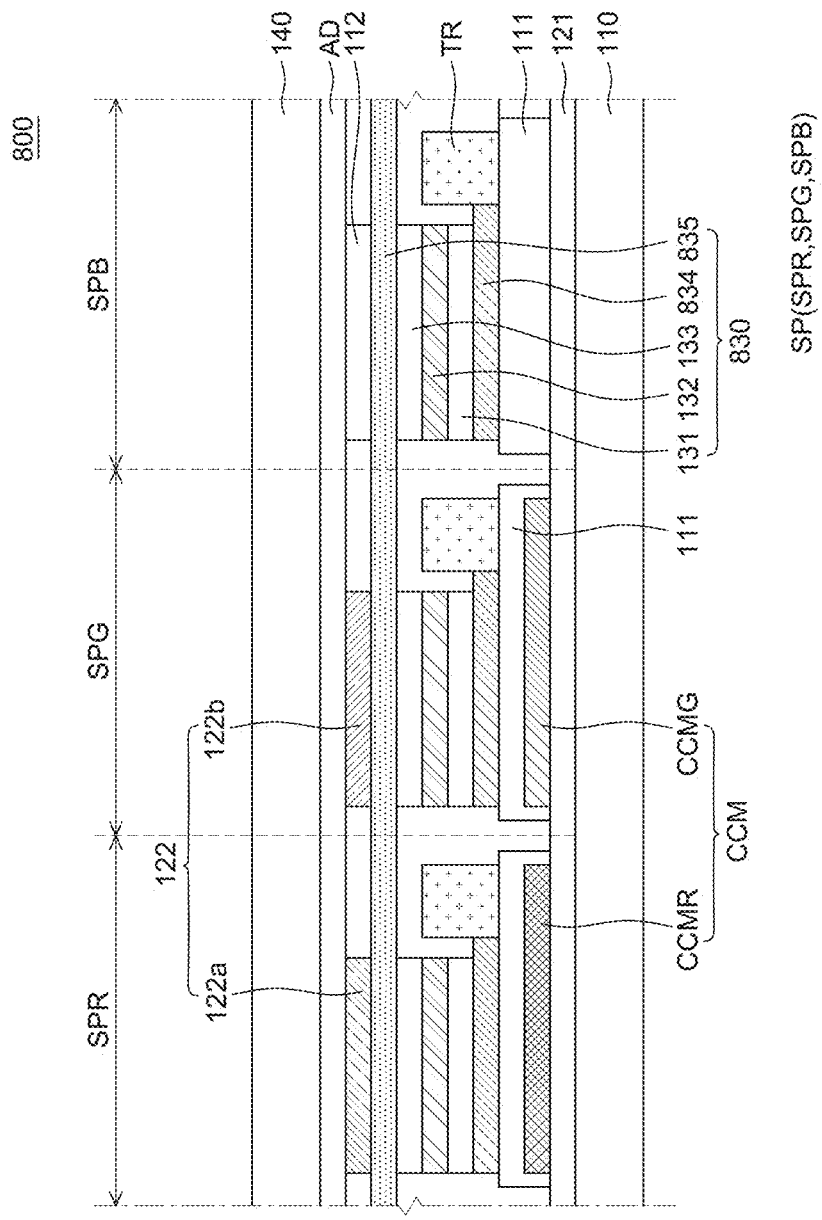
FIG. 8 is a cross-sectional view of a display device according to another exemplary embodiment of the present disclosure.

FIG. 8 is a cross-sectional view of a display device according to another exemplary embodiment of the present disclosure. Compared to the display device 100 of FIGS. 1 to 3, a display device 800 of FIG. 8 further includes transistors TR, and other configurations thereof are substantially the same as those of the display device 100 of FIGS. 1 to 3 except that electrodes of the plurality of LEDs 830 are different. Thus, redundant descriptions are omitted.

Referring to FIG. 8, the plurality of LEDs 830 includes a plurality of first electrodes 834 and a second electrode 835. The second electrode 835 is formed under the first semiconductor layers 131 of the plurality of respective LEDs 830. The first electrodes 834 may be formed to correspond to the first semiconductor layers 131 of the plurality of LEDs 830 on a one-to-one basis. The plurality of LEDs 830 may be electrically connected to the first electrodes 834 that are different from each other.

The second electrode 835 may be formed on the entire surface of the second substrate 140 and may be electrically connected to the second semiconductor layers 133 of the plurality of LEDs 830. That is, the plurality of LEDs 830 may share one second electrode 835.

The transistor TR is disposed in each of the plurality of sub-pixels SP. The plurality of transistors TR are driving elements for driving the plurality of respective LEDs 830. The plurality of transistors TR may be, for example, thin film transistors (TFT), N-channel metal oxide semiconductors (NMOS), P-channel metal oxide semiconductors (PMOS), complementary metal oxide semiconductors (CMOS), field effect transistors (FET), or the like, but are not limited thereto.

The plurality of transistors TR may be electrically connected to the plurality of first electrodes 834 of the plurality of LEDs 830. For example, source electrodes or drain electrodes of the plurality of transistors TR may be electrically connected to the plurality of first electrodes 834 and control voltages transmitted to the plurality of LEDs 830.

In this case, the plurality of transistors TR may be formed on the second substrate 140 together with the plurality of LEDs 830. For example, the plurality of transistors TR and the plurality of LEDs 830 may be formed together on a wafer WF, and the plurality of transistors TR may be electrically connected to a plurality of second electrodes 835 by bonding the second substrate 140 and the first substrate 110 together. Accordingly, a process of forming the plurality of transistors TR may be variously implemented, but is not limited thereto.

Meanwhile, in FIG. 8, it has been described that the plurality of LEDs 830 includes the plurality of first electrodes 834 and one second electrode 835, and the plurality of transistors TR are electrically connected to the plurality of first electrodes 834, respectively. However, the present disclosure is not limited thereto. For example, the plurality of LEDs 830 may include one or more first electrodes 834 and the plurality of second electrodes 835, and the transistors TR may be electrically connected to the plurality of second electrodes 835.

In addition, although the plurality of transistors TR are illustrated as being disposed between the plurality of first electrodes 834 and the second electrodes 835 in FIG. 8, the plurality of transistors TR may be formed between the plurality of LEDs 830 and the first substrate 110. In this case, the plurality of transistors TR may be formed on the first substrate 110, and the first substrate 110 on which the plurality of transistors TR are formed and the second substrate 140 on which the plurality of LEDs 830 are formed may be bonded, so that the plurality of transistors TR and the plurality of LEDs 830 may be electrically connected.

In the display device 800 according to another exemplary embodiment of the present disclosure, the display device 800 in an active-matrix method may be implemented by forming the plurality of transistors TR. Specifically, the active-matrix method may further include transistors TR serving as switches to individually drive each of the plurality of LEDs 830. The plurality of LEDs 830 may include a plurality of first electrodes 834 separated from each other and a second electrode 835 formed on the entire surface of the second substrate 140. In addition, the plurality of transistors TR may be electrically connected to the plurality of first electrodes 834. In this case, the plurality of LEDs 830 may be driven by a voltage transmitted to the plurality of first electrodes 834 and a voltage transmitted to the second electrode 835 through the plurality of transistors TR. For example, in a situation where a constant voltage is applied to the second electrode 835, the voltages transmitted from the plurality of transistors TR to the plurality of respective first electrodes 834 may be adjusted to drive the plurality of LEDs 830. Accordingly, the display device 800 according to another exemplary embodiment of the present disclosure may include the plurality of transistors TR, so it may be driven in the active-matrix method.

The exemplary embodiments of the present disclosure can also be described as follows:

According to an aspect of the present disclosure, there is provided a display device. The display device includes a substrate on which a plurality of sub-pixels is disposed, a first reflective layer disposed on the substrate, a plurality of LEDs disposed in each of the plurality of sub-pixels on the first reflective layer, a plurality of light conversion layers disposed between the first reflective layer and the plurality of LEDs, and a plurality of second reflective layers covering at least a portion of the plurality of LEDs. A light emitted from the plurality of LEDs is reflected by the plurality of second reflective layers, and light having a wavelength longer than that of the light emitted from the plurality of LEDs is emitted upwardly from the plurality of LEDs.

The plurality of sub-pixels may include a red sub-pixel displaying red light, a green sub-pixel displaying green light, and a blue sub-pixel displaying blue light. The plurality of LEDs may be blue LEDs.

The plurality of light conversion layers may include a red light conversion layer disposed in the red sub-pixel and a green light conversion layer disposed in the green sub-pixel.

The plurality of light conversion layers may be disposed in the red sub-pixel and the green sub-pixel. The plurality of second reflective layers may be disposed in the red sub-pixel and the green sub-pixel.

The first reflective layer may reflect the light from the plurality of LEDs toward the plurality of light conversion layers. A light that is converted in the plurality of light conversion layers may pass through the plurality of second reflective layers. The plurality of second reflective layers may reflect the light emitted from the plurality of LEDs toward the first reflective layer.

The display device may further include a plurality of insulating layers covering the plurality of respective light conversion layers between the plurality of LEDs and the plurality of light conversion layers. The plurality of insulating layers may be spaced apart from each other.

A refractive index of the plurality of insulating layers may be higher than a refractive index of a region between the plurality of insulating layers.

Each of the plurality of LEDs may include a first semiconductor layer, a light emitting layer disposed on the first semiconductor layer, and a second semiconductor layer disposed on the light emitting layer.

The plurality of LEDs may further include a plurality of first electrodes electrically connected to the first semiconductor layers of the plurality of LEDs, and a plurality of second electrodes electrically connected to the second semiconductor layers of the plurality of LEDs. Each of the plurality of first electrodes may be electrically connected to the first electrode adjacent thereto in a first direction, and each of the plurality of second electrodes may be electrically connected to the second electrode adjacent thereto in a second direction different from the first direction.

The display device may further include a transistors electrically connected to the plurality of respective LEDs.

According to another aspect of the present disclosure, there is provided a display device. The display device includes a substrate, a first reflective layer disposed on the substrate, a plurality of light conversion layers disposed on the first reflective layer, a plurality of blue LEDs disposed on the plurality of light conversion layers, and a plurality of second reflective layers disposed to cover at least a portion of the plurality of blue LEDs. The plurality of second reflective layers reflects blue light emitted from the plurality of blue LEDs toward the plurality of light conversion layers and transmit light from the plurality of light conversion layers.

The plurality of light conversion layers may include a red light conversion layer overlapping one part of the plurality of blue LEDs, and a green light conversion layer overlapping another part of the plurality of blue LEDs.

The plurality of second reflective layers may overlap the red light conversion layer and the green light conversion layer.

The plurality of light conversion layers and the plurality of second reflective layers may do not overlap a remaining blue LED of the plurality of blue LEDs.

The first reflective layer may be formed of an opaque metallic material. The second reflective layer may be a distributed Bragg reflector (DBR).

The display device may further include a plurality of insulating layers surrounding upper surfaces and side surfaces of the plurality of respective light conversion layers between the plurality of light conversion layers and the plurality of blue LEDs. The plurality of insulating layers may planarize upper portions of the plurality of light conversion layers.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a substrate on which a plurality of sub-pixels is disposed;
a first reflective layer disposed on the substrate;
a plurality of LEDs disposed in each of the plurality of sub-pixels on the first reflective layer;
a plurality of light conversion layers disposed between the first reflective layer and the plurality of LEDs; and
a plurality of second reflective layers covering at least a portion of the plurality of LEDs,
wherein light emitted from the plurality of LEDs is reflected by the plurality of second reflective layers, and light having a wavelength longer than that of the light emitted from the plurality of LEDs is emitted upwardly from the plurality of LEDs.

2. The display device of claim 1, wherein the plurality of sub-pixels includes:
a red sub-pixel displaying red light;
a green sub-pixel displaying green light; and
a blue sub-pixel displaying blue light,
wherein the plurality of LEDs are blue LEDs.

3. The display device of claim 2, wherein the plurality of light conversion layers includes:
a red light conversion layer disposed in the red sub-pixel; and
a green light conversion layer disposed in the green sub-pixel.

4. The display device of claim 2, wherein the plurality of light conversion layers is disposed in the red sub-pixel and the green sub-pixel,
wherein the plurality of second reflective layers is disposed in the red sub-pixel and the green sub-pixel.

5. The display device of claim 1, wherein the first reflective layer reflects the light from the plurality of LEDs toward the plurality of light conversion layers,
wherein light that is converted in the plurality of light conversion layers passes through the plurality of second reflective layers and
wherein the plurality of second reflective layers reflects the light emitted from the plurality of LEDs toward the first reflective layer.

6. The display device of claim 1, further comprising:
a plurality of insulating layers covering the plurality of respective light conversion layers between the plurality of LEDs and the plurality of light conversion layers,
wherein the plurality of insulating layers is spaced apart from each other.

7. The display device of claim 6, wherein a refractive index of the plurality of insulating layers is higher than a refractive index of a region between the plurality of insulating layers.

8. The display device of claim 1, wherein each of the plurality of LEDs includes:
a first semiconductor layer;
a light emitting layer disposed on the first semiconductor layer; and
a second semiconductor layer disposed on the light emitting layer.

9. The display device of claim 8, wherein the plurality of LEDs further includes:
a plurality of first electrodes electrically connected to the first semiconductor layers of the plurality of LEDs; and
a plurality of second electrodes electrically connected to the second semiconductor layers of the plurality of LEDs,
wherein each of the plurality of first electrodes is electrically connected to the first electrode adjacent thereto in a first direction,
wherein each of the plurality of second electrodes is electrically connected to the second electrode adjacent thereto in a second direction different from the first direction.

10. The display device of claim 8, further comprising:
a transistors electrically connected to the plurality of respective LEDs.

11. A display device, comprising:
a substrate:
a first reflective layer disposed on the substrate;

a plurality of light conversion layers disposed on the first reflective layer;

a plurality of blue LEDs disposed on the plurality of light conversion layers; and a plurality of second reflective layers disposed to cover at least a portion of the plurality of blue LEDs, wherein the plurality of second reflective layers reflects blue light emitted from the plurality of blue LEDs toward the plurality of light conversion layers and transmit light from the plurality of light conversion layers.

12. The display device of claim 11, wherein the plurality of light conversion layers includes:

a red light conversion layer overlapping one part of the plurality of blue LEDs; and a green light conversion layer overlapping another part of the plurality of blue LEDs.

13. The display device of claim 12, wherein the plurality of second reflective layers overlaps the red light conversion layer and the green light conversion layer.

14. The display device of claim 12, wherein the plurality of light conversion layers and the plurality of second reflective layers do not overlap a remaining blue LED of the plurality of blue LEDs.

15. The display device of claim 11, wherein the first reflective layer is formed of an opaque metallic material, wherein the second reflective layer is a distributed Bragg reflector (DBR).

16. The display device of claim 11, further comprising:

a plurality of insulating layers surrounding upper surfaces and side surfaces of the plurality of respective light conversion layers between the plurality of light conversion layers and the plurality of blue LEDs, wherein the plurality of insulating layers planarize upper portions of the plurality of light conversion layers.

* * * * *